US009601456B2

(12) United States Patent
Rong et al.

(10) Patent No.: US 9,601,456 B2
(45) Date of Patent: Mar. 21, 2017

(54) SYSTEM-IN-PACKAGE MODULE AND MANUFACTURE METHOD FOR A SYSTEM-IN-PACKAGE MODULE

(71) Applicant: Etron Technology, Inc., Hsinchu (TW)

(72) Inventors: Bor-Doou Rong, Hsinchu County (TW); Weng-Dah Ken, Hsinchu (TW)

(73) Assignee: Etron Technology, Inc., Hsinchu (TW)

( * ) Notice: Subject to any disclaimer, the term of this patent is extended or adjusted under 35 U.S.C. 154(b) by 108 days.

(21) Appl. No.: 14/599,999

(22) Filed: Jan. 19, 2015

(65) Prior Publication Data

US 2015/0206849 A1    Jul. 23, 2015

Related U.S. Application Data

(60) Provisional application No. 61/929,130, filed on Jan. 20, 2014.

(51) Int. Cl.
| | |
|---|---|
| *H01L 23/544* | (2006.01) |
| *H01L 23/00* | (2006.01) |
| *H01L 25/18* | (2006.01) |
| *H01L 25/00* | (2006.01) |
| *H01L 25/065* | (2006.01) |
| *H01L 23/31* | (2006.01) |

(52) U.S. Cl.
CPC ............. *H01L 24/49* (2013.01); *H01L 24/09* (2013.01); *H01L 25/0655* (2013.01); *H01L 25/18* (2013.01); *H01L 25/50* (2013.01); *H01L 23/31* (2013.01); *H01L 2224/05554* (2013.01); *H01L 2224/49* (2013.01); *H01L 2924/00014* (2013.01); *H01L 2924/1434* (2013.01)

(58) Field of Classification Search
CPC ..... H01L 24/49; H01L 24/09; H01L 21/8229; H01L 21/8239; H01L 25/0655
See application file for complete search history.

(56) References Cited

U.S. PATENT DOCUMENTS 5,705,425 A * 1/1998 Miura ..................... H01L 21/84
257/E21.703
6,531,782 B1 * 3/2003 Jones ..................... H01L 24/49
257/203
(Continued)

FOREIGN PATENT DOCUMENTS

TW          201330214 A1    7/2013
TW          201340256 A     10/2013

*Primary Examiner* — Joshua King
(74) *Attorney, Agent, or Firm* — Winston Hsu; Scott Margo

(57) ABSTRACT

A system-in-package module includes a non-memory chip, a bundled memory, and an encapsulation package material. The non-memory chip has a plurality of pads. The bundled memory includes a first memory die and a second memory die side-by-side formed over a substrate, wherein the first memory die includes a first group of pads and the second memory die includes a second group of pads. The encapsulation package material encloses the non-memory chip and the bundled memory, and the non-memory chip is electronically coupling with the bundled memory through the plurality of pads, the first and the second group of pads. The first group of pads corresponds to the second group of pads by rotating a predetermined degree or by mirror mapping.

12 Claims, 11 Drawing Sheets

(56) References Cited

U.S. PATENT DOCUMENTS

| | | | |
|---|---|---|---|
| 7,391,634 B2 * | 6/2008 | Kim | G11C 7/22 |
| | | | 365/51 |
| 2002/0140107 A1 * | 10/2002 | Kato | H01L 22/22 |
| | | | 257/777 |
| 2007/0001316 A1 * | 1/2007 | Choi | H01L 23/49838 |
| | | | 257/779 |
| 2007/0090500 A1 * | 4/2007 | Poechmueller | G11C 5/025 |
| | | | 257/666 |
| 2009/0008799 A1 * | 1/2009 | Lee | G01R 31/31704 |
| | | | 257/777 |
| 2010/0327424 A1 * | 12/2010 | Braunisch | H01L 23/13 |
| | | | 257/692 |

* cited by examiner

SYSTEM-IN-PACKAGE MODULE AND MANUFACTURE METHOD FOR A SYSTEM-IN-PACKAGE MODULE

CROSS REFERENCE TO RELATED APPLICATIONS

This application claims the benefit of U.S. Provisional Application No. 61/929,130, filed on Jan. 20, 2014 and entitled "Bundled memory with new relocated pads," the contents of which are incorporated herein by reference.

BACKGROUND OF THE INVENTION

1. Field of the Invention

The present invention relates to a system-in-package module and a manufacture method for a system-in-package module, and particularly to a system-in-package module and a manufacture method for a system-in-package module that can make a plurality of pads of a non-memory chip of the system-in-package module be electronically coupling with a plurality of pads of each memory die within a bundled memory without longer wire bonding or additional redistribution layers by rearranging locations of a plurality of pads of each memory die within the bundled memory.

2. Description of the Prior Art

Please refer to FIG. 1. FIG. 1 is a diagram illustrating a wafer 11 with a plurality of memory dies and a magnified structure of a memory die, wherein the wafer 11 includes a plurality of repeating units called dies. As shown in FIG. 1, in the wafer 11, a first memory die 121 is isolated from other dies, and separated from a second memory die 122 by a scribe line 12. In addition, after fabrication of the wafer 11 is completed, a plurality of memory dies of the wafer 11 are separated from each other by scribe lines, and each memory die of the plurality of memory dies has a plurality of pads disposed over the same location. For example, the first memory die 121 has a first group of pads 1211 disposed over or near an upper side of the first memory die 121, and the second memory die 122 has a second group of pads 1221 disposed over or near an upper side of the second memory die 122.

Generally speaking, after fabrication of the wafer 11 is completed, the wafer 11 is scribed into a plurality of individual separable memory dies (e.g. the first memory die 121 and the second memory die 122). However, sometimes it is required to scribe two memory dies together into one bundled memory 13 or four memory dies together into one bundled memory 14. For example, if a memory size and a bus width of each memory die are 2M×32 bit, respectively, the bundled memory 13 could have a bigger memory size (4M) and the same bus width (32 bits), or a bigger bus width (64 bits) and the same memory size (2M). In addition, the bundled memory 14 also has a bigger memory size (8M) and the same bus width (32 bits), or a bigger bus width (128 bits) and the same memory size (2M).

When the bundled memory 13 is stacked with another logic integrated circuit (a non-memory circuit, wherein the non-memory integrated circuit can be comprised of logic based semiconductor processes, RF, Analog and mix-mode circuits, etc. and the memory can be comprised of memory-based semiconductor processes, including DRAM, SRAM, NAND, MRAM, PRAM, RRAM, etc., wherein US Patent Application Publication No. 2013/0091315 and US Patent Application Publication No. 2013/0091312 have disclosed that memory ICs are stacked with a logic unit) each other, and then the bundled memory 13 and the logic integrated circuit (IC) are packaged or encapsulated together, if a portion of the second group of pads 1221 (or the first group of pads 1211) is covered by an active circuit region of the logic IC, it is difficult to electronically coupling with a plurality of pads of the logic IC to the portion of the second group of pads 1221 (or the first group of pads 1211) covered by the active circuit region of the logic IC without costly effort. That is to say, the plurality of pads of the logic IC either need longer wire bonds or extra redistribution layers (RDL) to be electronically coupling with the portion of the second group of pads 1221 (or the first group of pads 1211) covered by the active circuit region of the logic IC. On the other hand, a conventional dicing process is more lengthened, a form factor of a system-in-package module (or Multi-Chip Packaging (MCP)) is larger, and cost of materials is higher. Therefore, the prior art is not a good choice for the system-in-package module.

SUMMARY OF THE INVENTION

An embodiment provides a system-in-package module. The system-in-package module includes a non-memory chip, a bundled memory, and an encapsulation package material. The non-memory chip has a plurality of pads. The bundled memory includes a first memory die and a second memory die, wherein the first memory die and the second memory die are side-by-side formed over a substrate, the first memory die includes a first group of pads arranged over or near one side of the first memory die, and the second memory die includes a second group of pads arranged over or near one side of the second memory die. The encapsulation package material encloses the non-memory chip and the bundled memory, wherein the non-memory chip is electronically coupling with the bundled memory through the plurality of pads, the first group of pads, and the second group of pads. The first group of pads correspond to the second group of pads by rotating a predetermined degree or by mirror mapping.

Another embodiment provides a manufacture method for a system-in-package module. The system-in-package module includes forming a bundled memory comprising a first memory die and a second memory die, wherein the first memory die and the second memory die are side-by-side formed over a substrate, the first memory die includes a first group of pads arranged over or near one side of the first memory die, and the second memory die includes a second group of pads arranged over or near one side of the second memory die, wherein the first group of pads correspond to the second group of pads by rotating a predetermined degree or by mirror mapping.

The present invention provides a system-in-package module and a manufacture method for a system-in-package module. The system-in-package module and the manufacture method rearrange locations of a plurality of pads of each memory die within a bundled memory to make most (or whole) of a plurality of pads of each memory die within the bundled memory be not covered by an active circuit region of a non-memory chip. Therefore, compared to the prior art, a plurality of pads of the non-memory chip within the system-in-package module are electronically coupling with a plurality of pads of each memory die within the bundled memory without longer wire bonding or additional redistribution layers, so total system level delay time of the system-in-package module can be reduced. That is to say, the system-in-package module has better power consumption and operating performance.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
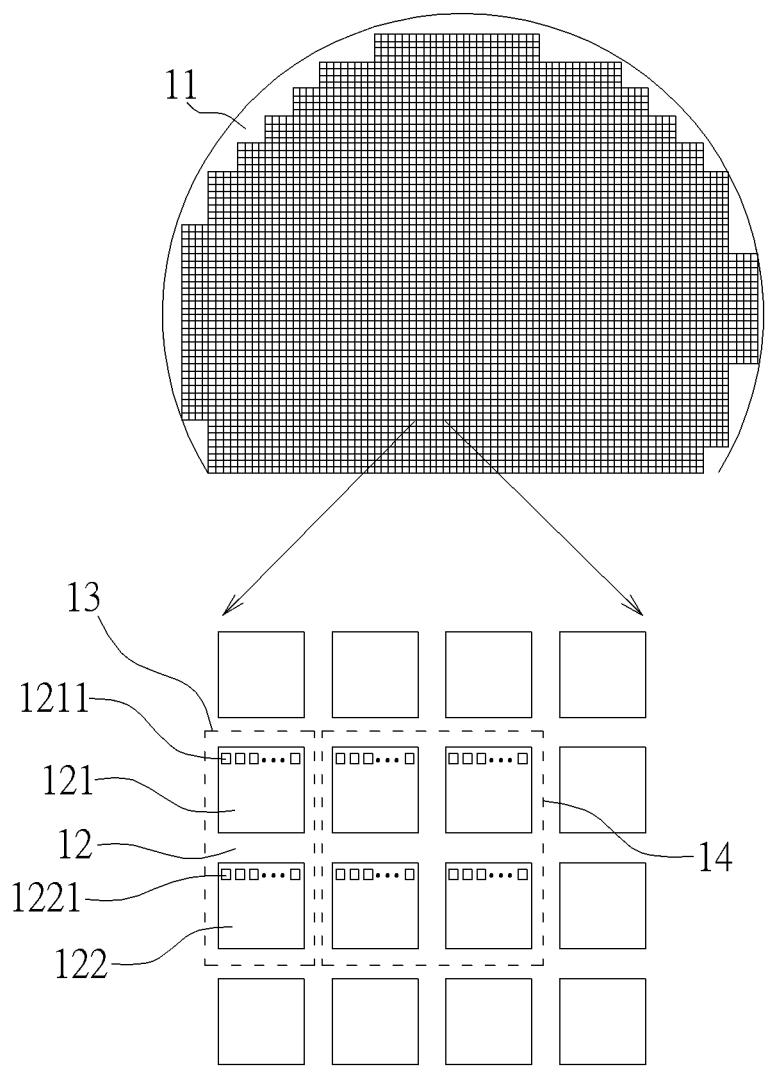
FIG. 1 is a diagram illustrating a wafer with a plurality of memory dies and a magnified structure of a memory die.
Figure 2:
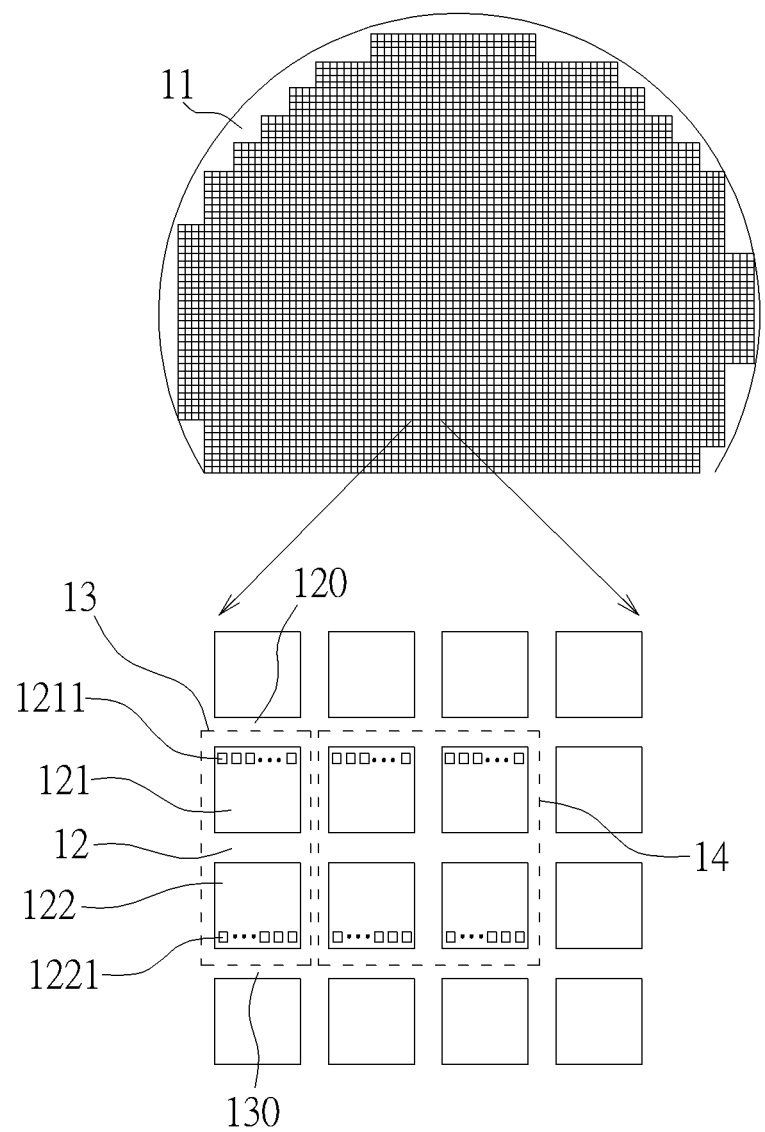
FIG. 2 is a diagram illustrating a wafer with a plurality of memory dies and a magnified structure of a memory die according to a first embodiment.

Please refer to FIG. 2. FIG. 2 is a diagram illustrating a wafer 11 with a plurality of memory dies and a magnified structure of a memory die according to a first embodiment. As shown in FIG. 2, the wafer 11 includes a plurality of individual separable memory dies (e.g. a first memory die 121 and a second memory die 122), wherein each memory die of the wafer 11 is identical and has a group of pads. For example, the first memory die 121 has a first group of pads 1211 and the second memory die 122 has a second group of pads 1221. In one embodiment of the present invention, the first memory die 121 and the second memory die 122 are combined together to form a bundled memory 13, and other four memory dies are combined together to form a bundled memory 14. In addition, each memory die of the wafer 11 is separated from other adjacent memory dies through scribe lines, the wafer 11 can be a silicon substrate, and the plurality of memory dies can be formed over the wafer 11 according to a regular semiconductor process.

Figure 5:
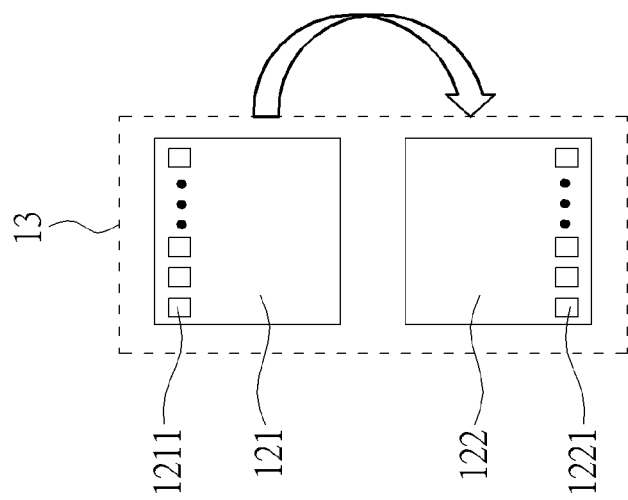
FIG. 5 is a diagram illustrating the second group of pads of the second memory die corresponding to the first group of pads of the first memory die by mirror mapping.
Figure 4:
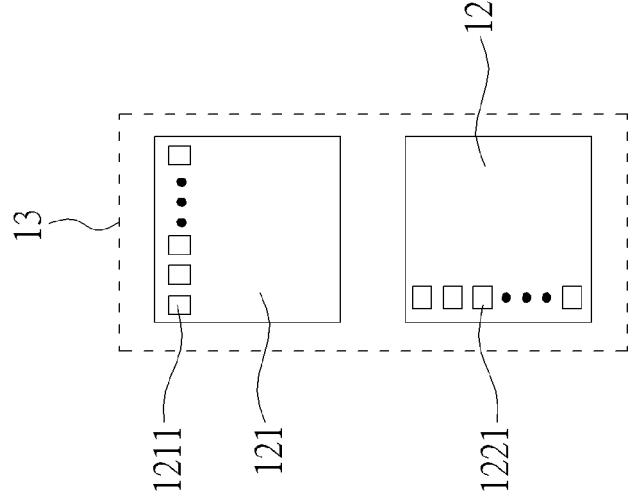
FIG. 4 is a diagram illustrating the second group of pads of the second memory die corresponding to the first group of pads of the first memory die by rotating a degree 90° or a degree 270°.
Figure 3:
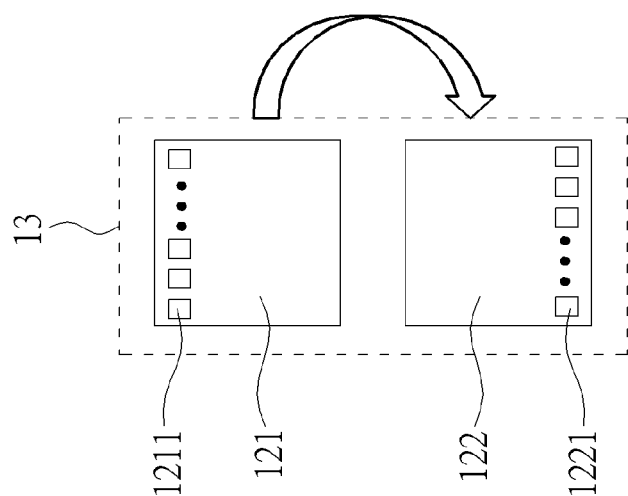
FIG. 3 is a diagram illustrating the second group of pads of the second memory die corresponding to the first group of pads of the first memory die by rotating a degree 180°.

As shown in FIG. 2, a scribe line 12 is disposed between the first memory die 121 and the second memory die 122, wherein a side with the first group of pads 1211 of the first memory die 121 is not adjacent to the scribe line 12 and a side with the second group of pads 1221 of the second memory die 122 is also not adjacent to the scribe line 12. As shown in FIG. 2, the scribe lines of the wafer 11 can be divided into at least two types (one is finally scribed by a die saw step and the other is not scribed by the die saw step). For example, the scribe line 12 will not be scribed by the die saw step (that is, the scribe line 12 will be maintained between the first memory die 121 and the second memory die 122). However, scribe lines 120, 130 outside the bundled memory 13 will be scribed by the die saw step. In addition, in another embodiment of the present invention, the second group of pads 1221 of the second memory die 122 can correspond to the first group of pads 1211 of the first memory die 121 by rotating a predetermined degree (e.g. a degree 180° shown in FIG. 3, or a degree 90° or a degree 270° shown in FIG. 4). In addition, in another embodiment of the present invention, the second group of pads 1221 of the second memory die 122 can correspond to the first group of pads 1211 of the first memory die 121 by mirror mapping (as shown in FIG. 5).

Figure 6:
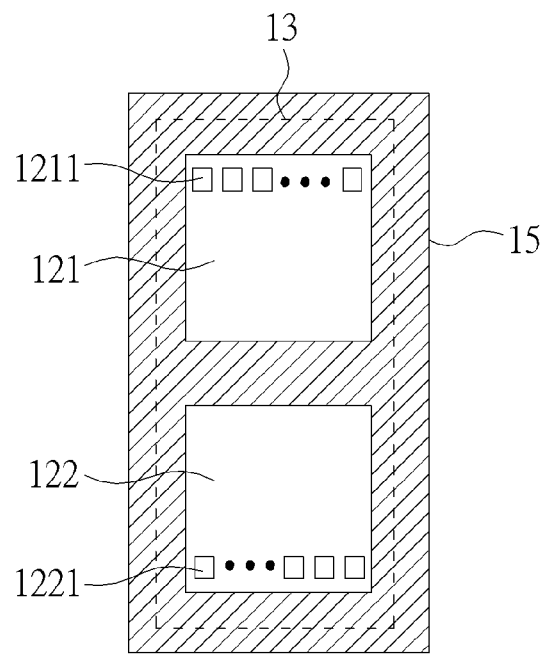
FIGS. 6, 7 are diagrams illustrating the non-memory chip being stacked or disposed under the scribe line of the bundled memory.
Figure 7:
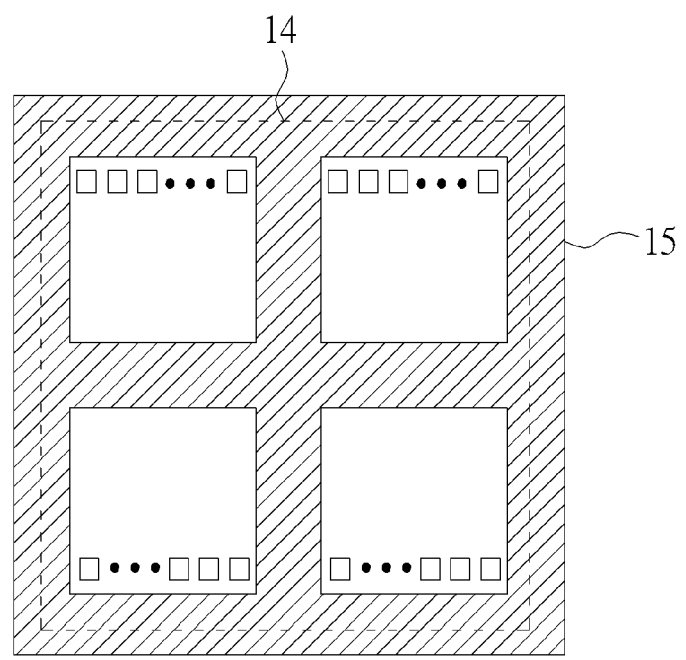
Figure 8:
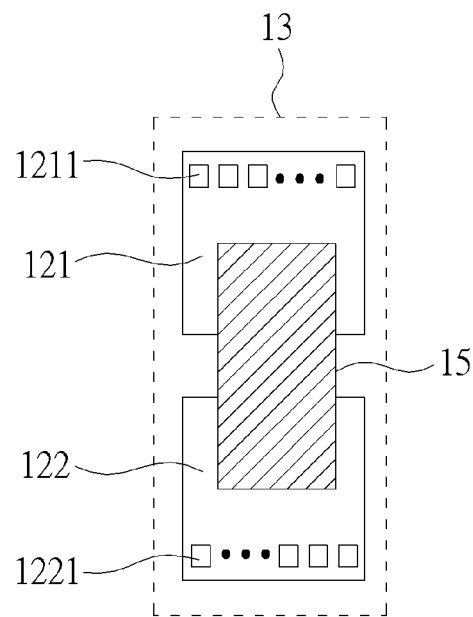
FIGS. 8-11 are diagrams illustrating the non-memory chip being stacked or disposed over the scribe line of the bundled memory.
Figure 9:
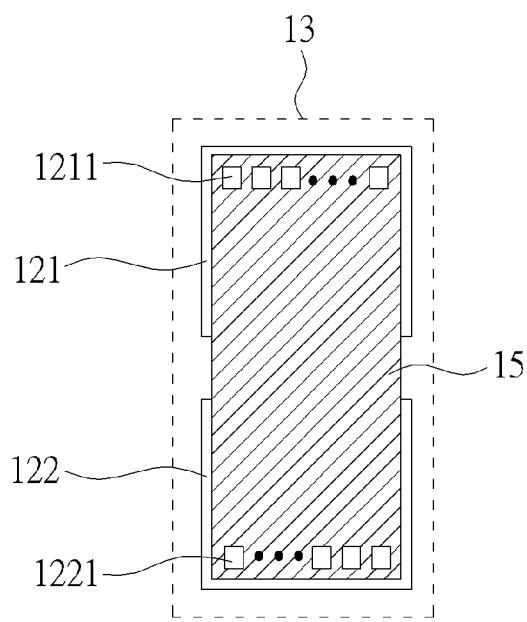
Figure 10:
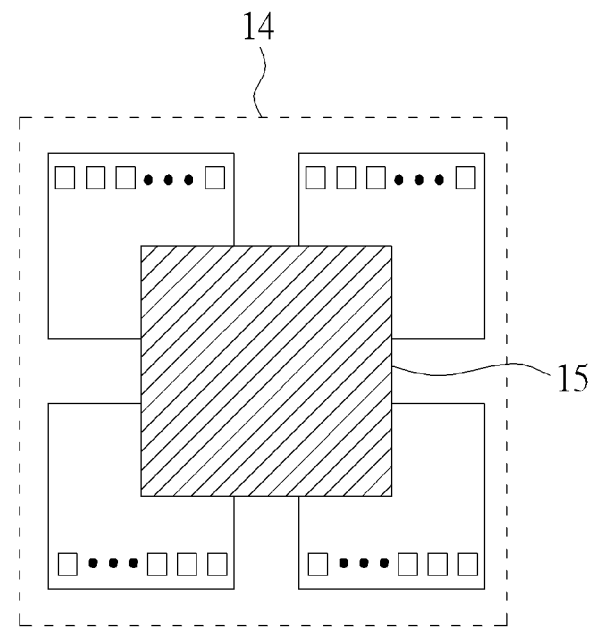
Figure 11:
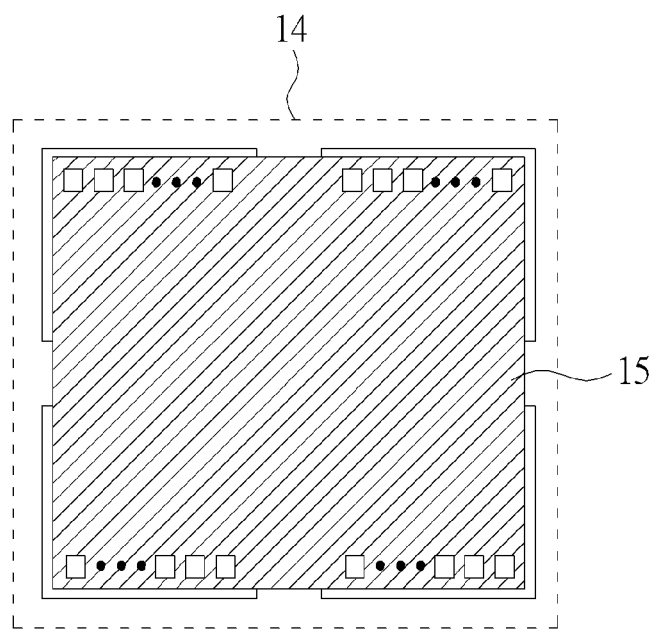

The bundled memory 13 or the bundled memory 14 scribed on the wafer 11 can be stacked with another non-memory chip 15 (e.g. a logic IC) together. For example, the non-memory chip 15 can be stacked or disposed under a scribe line of the bundled memory 13 (as shown in FIG. 6) or scribe lines of the bundled memory 14 (as shown in FIG. 7). But, in another embodiment of the present invention, the non-memory chip 15 can be stacked or disposed over the scribe line of the bundled memory 13 (as shown in FIGS. 8, 9) or the scribe lines of the bundled memory 14 (as shown in FIGS. 10, 11). The non-memory chip 15 also has a plurality of pads and when the non-memory chip 15 is stacked or disposed under the scribe line of the bundled memory 13 (as shown in FIG. 6) or over the scribe line of the bundled memory 13 (as shown in FIG. 8), the non-memory chip 15 is electronically coupling with the bundled memory 13 through the plurality of pads, the first group of pads 1211, and the second group of pads 1221, wherein in FIGS. 6, 8, the plurality of pads of the non-memory chip 15 can be electronically coupling with the first group of pads 1211 and the second group of pads 1221 of the bundled memory 13 by wire bonding. However, in FIG. 9, because locations of the plurality of pads of the non-memory chip 15 are over the first group of pads 1211 and the second group of pads 1221 of the bundled memory 13, the plurality of pads of the non-memory chip 15 can be electronically coupling with the first group of pads 1211 and the second group of pads 1221 of the bundled memory 13 by flip chip bonding. In addition, an electronically coupling method between the bundled memory 14 and the non-memory chip 15 is the same as the above mentioned electronically coupling method between the bundled memory 13 and the non-memory chip 15, so further description thereof is omitted for simplicity.

After the non-memory chip 15 is electronically coupling with the bundled memory 13 or the bundled memory 14, an encapsulation package material can be used for enclosing the non-memory chip 15 and the bundled memory 13, or the non-memory chip 15 and the bundled memory 14. Because the bundled memory 13 can rearrange locations of the first group of pads 1211 of the first memory die 121 and locations of the second group of pads 1221 of the second memory die 122 by FIGS. 3-5, most (or whole) of the first group of pads 1211 and the second group of pads 1221 are not covered by an active circuit region of the non-memory chip 15. That is to say, compared to the prior art, the plurality of pads of the non-memory chip 15 are electronically coupling with the first group of pads 1211 and the second group of pads 1221 without longer wire bonding or additional redistribution layers.

Figure 12:
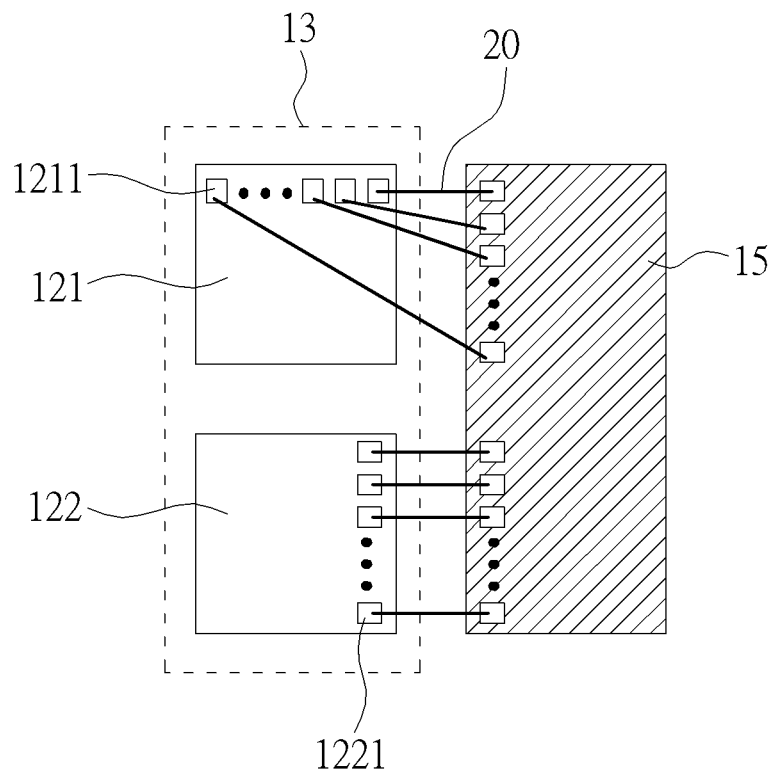
FIG. 12 is a diagram illustrating the bundled memory and the non-memory chip being side-by-side disposed within the encapsulation package material.

In addition, in another embodiment of the present invention, the bundled memory 13 and the non-memory chip 15 are side-by-side disposed within the encapsulation package material (as shown in FIG. 12). As shown in FIG. 12, the plurality of pads of the non-memory chip 15 can be electronically coupling with the first group of pads 1211 and the second group of pads 1221 of the bundled memory 13 by wire bonding (e.g. wires 20).

Figure 13:
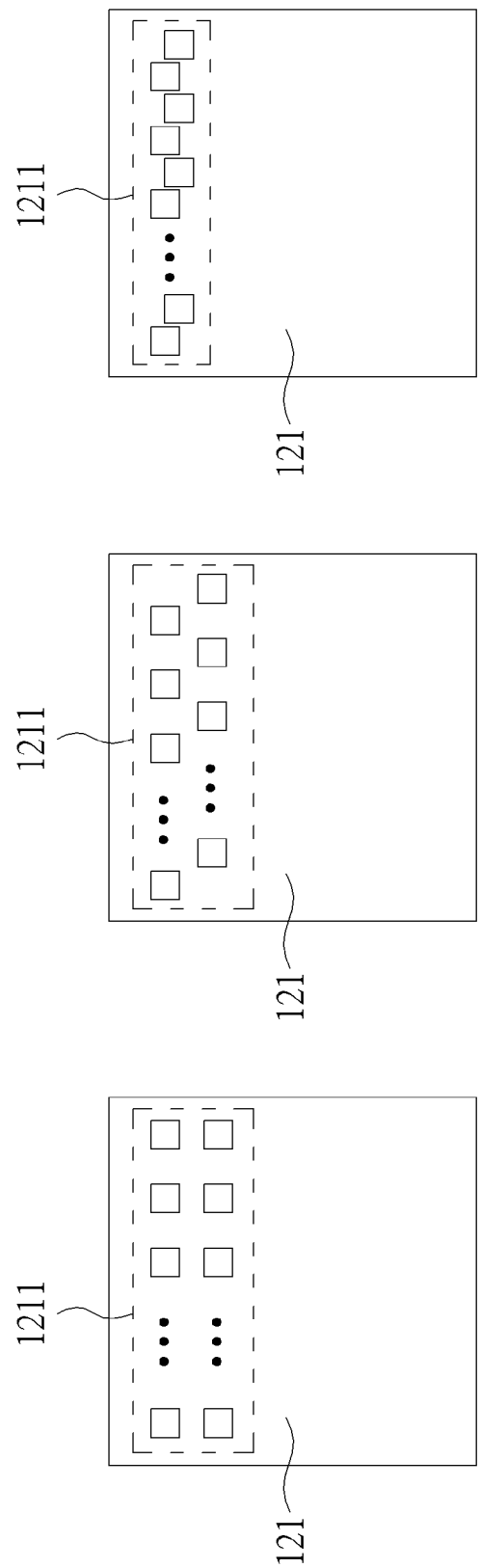
FIG. 13 is a diagram illustrating the first group of pads of the first memory die including at least two row of pads.
Figure 14:
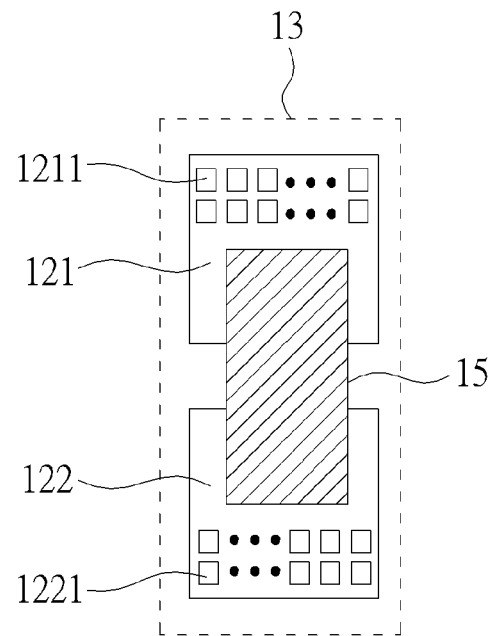
FIGS. 14, 15 are diagrams illustrating the location for disposing the non-memory chip.
Figure 15:
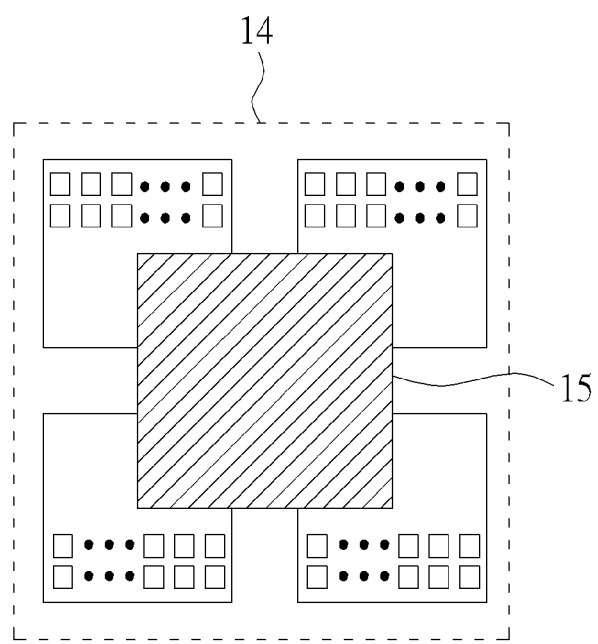

In addition, in another embodiment of the present invention, the first group of pads 1211 of the first memory die 121 can include at least two row of pads (as shown in FIG. 13). In addition, the second group of pads 1221 of the second memory die 122 can also include at least two row of pads or one row of pad. Therefore, when the first group of pads 1211 and the second group of pads 1221 within the bundled memory 13 include at least two row of pads, the non-memory chip 15 can be disposed a location shown in FIG. 14. Similarly, when a plurality of pads of at least one memory die of the bundled memory 14 include at least two row of pads, the non-memory chip 15 can be disposed a location shown in FIG. 15.

Figure 16:
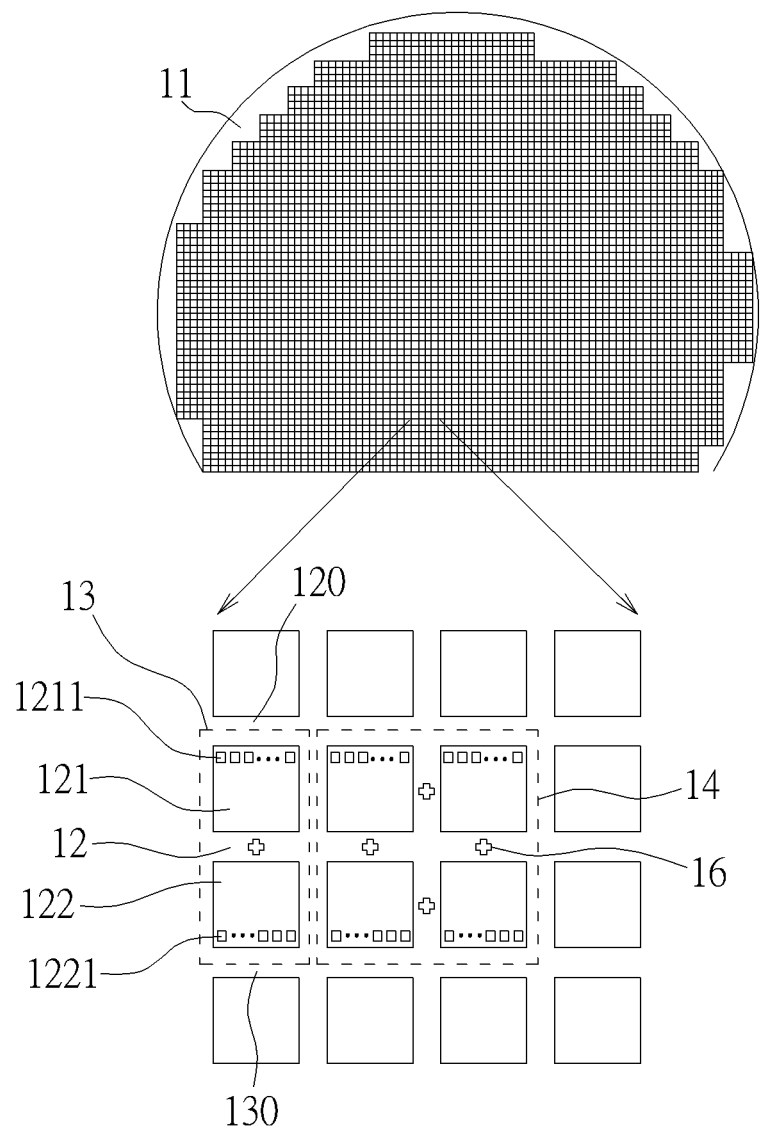
FIG. 16 is a diagram illustrating at least one alignment mark being disposed over the scribe line of the bundled memory.

In addition, in another embodiment of the present invention, at least one alignment mark 16 can be disposed over the scribe line 12 of the bundled memory 13 or the scribe lines of the bundled memory 14 (as shown in FIG. 16). For example, an alignment mark 16 is disposed over the scribe line 12 of the bundled memory 13, alignment marks 16 are disposed over the scribe lines of the bundled memory 14, wherein the alignment mark 16 of the bundled memory 13 corresponds to a unique orientation of the bundled memory 13 and the alignment marks 16 of the bundled memory 14 also correspond to a unique orientation of the bundled memory 14. Thus, the at least one alignment mark 16 can be used for reminding an operator not to cut the scribe lines which include the at least one alignment mark 16.

In addition, the bundled memory provided by the present invention is not limited to being composed of two individual memory dies and four individual memory dies. That is to say, the bundled memory provided by the present invention can be composed of a plurality of individual memory dies. In addition, the bundled memory provided by the present invention is also not limited to only being stacked with one non-memory chip each other or enclosed side-by-side together. That is to say, the bundled memory provided by the present invention can be stacked with at least one non-memory chip each other or enclosed side-by-side together.

Figure 17:
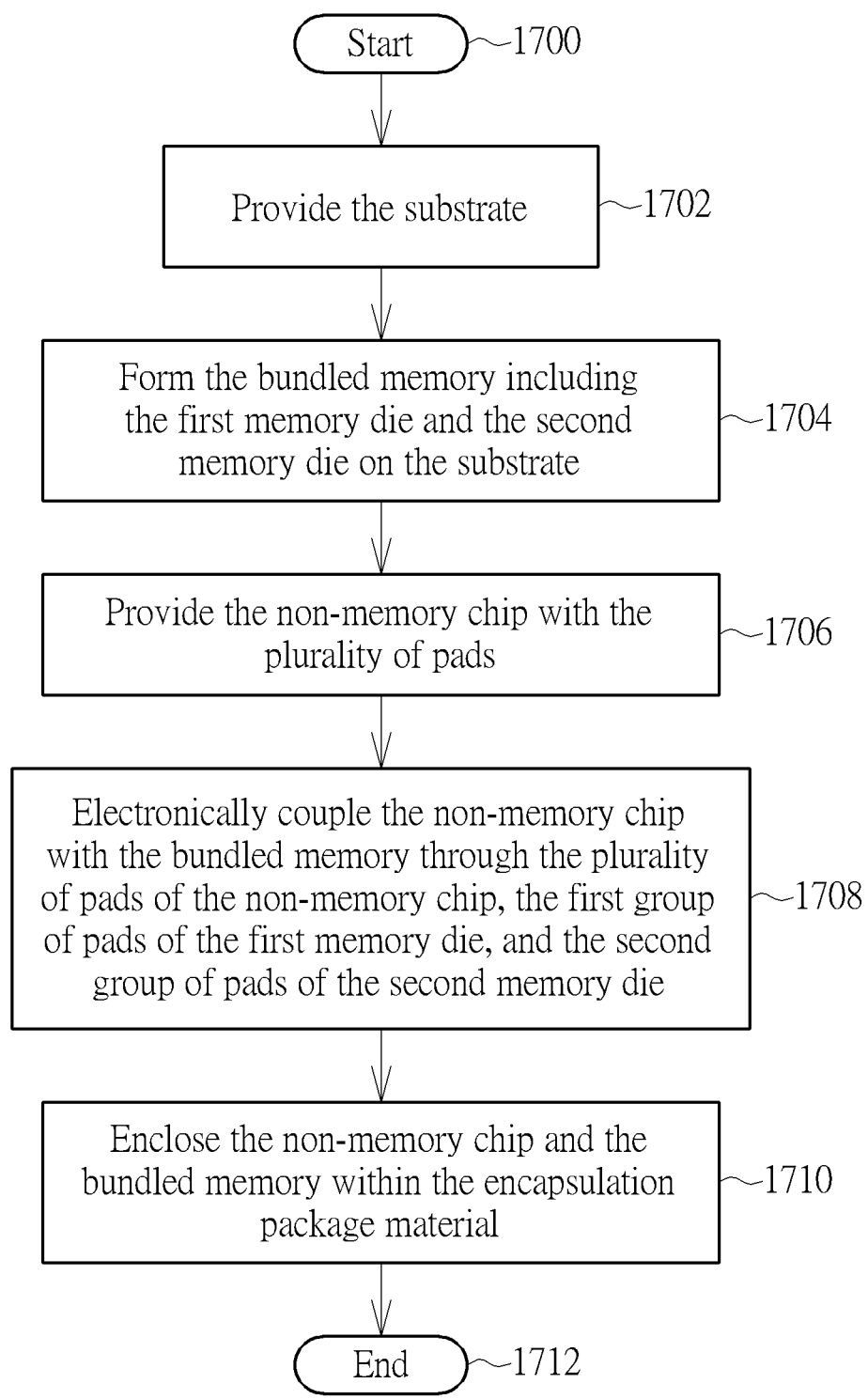
FIG. 17 is a flowchart illustrating a manufacture method for a system-in-package module according to a second embodiment.

Please refer to FIGS. 2-12, FIG. 16, and FIG. 17. FIG. 17 is a flowchart illustrating a manufacture method for a system-in-package module according to a second embodiment. The manufacture method in FIG. 17 is illustrated using the wafer 11, the scribe line 12, the first memory die 121, the first group of pads 1211, the second memory die 122, the second group of pads 1221, the bundled memory 13, and the bundled memory 14 in FIG. 2. Detailed steps are as follows:

Step 1700: Start.
Step 1702: Provide the substrate.
Step 1704: Form the bundled memory 13 including the first memory die 121 and the second memory die 122 on the substrate.
Step 1706: Provide the non-memory chip 15 with the plurality of pads.
Step 1708: Electronically couple the non-memory chip 15 with the bundled memory 13 through the plurality of pads of the non-memory chip 15, the first group of pads 1211 of the first memory die 121, and the second group of pads 1221 of the second memory die 122.

Step 1710: Enclose the non-memory chip 15 and the bundled memory 13 within the encapsulation package material.

Step 1712: End.

In Step 1702, as shown in FIG. 2, the substrate is the wafer 11, and the wafer 11 can be a silicon substrate. In Step 1704, the first memory die 121 and the second memory die 122 are side-by-side combined together to form the bundled memory 13, wherein the scribe line 12 is disposed between the first memory die 121 and the second memory die 122, the side with the first group of pads 1211 of the first memory die 121 is not adjacent to the scribe line 12, and the side with the second group of pads 1221 of the second memory die 122 is also not adjacent to the scribe line 12. In addition, in another embodiment of the present invention, the second group of pads 1221 of the second memory die 122 can correspond to the first group of pads 1211 of the first memory die 121 by rotating the predetermined degree (e.g. the degree 180° shown in FIG. 3, or the degree 90° or the degree 270° shown in FIG. 4). In addition, in another embodiment of the present invention, the second group of pads 1221 of the second memory die 122 can correspond to the first group of pads 1211 of the first memory die 121 by mirror mapping (as shown in FIG. 5).

In Step 1708, the non-memory chip 15 can be stacked or disposed under the scribe line of the bundled memory 13 (as shown in FIG. 6) or the scribe lines of the bundled memory 14 (as shown in FIG. 7). But, in another embodiment of the present invention, the non-memory chip 15 can be stacked or disposed over the scribe line of the bundled memory 13 (as shown in FIGS. 8, 9) or the scribe lines of the bundled memory 14 (as shown in FIGS. 10, 11). When the non-memory chip 15 is stacked or disposed under the scribe line of the bundled memory 13 (as shown in FIG. 6) or over the scribe line of the bundled memory 13 (as shown in FIG. 8), the non-memory chip 15 is electronically coupling with the bundled memory 13 through the plurality of pads, the first group of pads 1211, and the second group of pads 1221, wherein in FIGS. 6, 8, the plurality of pads of the non-memory chip 15 can be electronically coupling with the first group of pads 1211 and the second group of pads 1221 of the bundled memory 13 by wire bonding. However, in FIG. 9, because the locations of the plurality of pads of the non-memory chip 15 are over the first group of pads 1211 and the second group of pads 1221 of the bundled memory 13, the plurality of pads of the non-memory chip 15 can be electronically coupling with the first group of pads 1211 and the second group of pads 1221 of the bundled memory 13 by flip chip bonding.

In Step 1710, after the non-memory chip 15 is electronically coupling with the bundled memory 13 or the bundled memory 14, the encapsulation package material can be used for enclosing the non-memory chip 15 and the bundled memory 13, or the non-memory chip 15 and the bundled memory 14. Because the bundled memory 13 can rearrange the locations of the first group of pads 1211 of the first memory die 121 and the second group of pads 1221 of the second memory die 122 by FIGS. 3-5, most (or whole) of the first group of pads 1211 and the second group of pads 1221 are not covered by the active circuit region of the non-memory chip 15. That is to say, compared to the prior art, the plurality of pads of the non-memory chip 15 are electronically coupling with the first group of pads 1211 and the second group of pads 1221 without longer wire bonding or an additional redistribution layer.

In addition, in another embodiment of the present invention, the bundled memory 13 and the non-memory chip 15 are side-by-side disposed within the encapsulation package material (as shown in FIG. 12). Therefore, as shown in FIG. 12, the plurality of pads of the non-memory chip 15 can be electronically coupling with the first group of pads 1211 and the second group of pads 1221 of the bundled memory 13 by wire bonding (e.g. the wires 20).

In addition, in another embodiment of the present invention, the at least one alignment mark 16 can be disposed over the scribe line of the bundled memory 13 or the scribe lines of the bundled memory 14 (as shown in FIG. 16). Thus, the at least one alignment mark 16 can be used for reminding an operator not to cut the scribe lines which include the at least one alignment mark 16.

To sum up, the system-in-package module and the manufacture method for the system-in-package module rearrange locations of a plurality of pads of each memory die within the bundled memory to make most (or whole) of a plurality of pads of each memory die within the bundled memory be not covered by the active circuit region of the non-memory chip. Therefore, compared to the prior art, the plurality of pads of the non-memory chip within the system-in-package module are electronically coupling with a plurality of pads of each memory die within the bundled memory without longer wire bonding or additional redistribution layers, so total system level delay time of the system-in-package module can be reduced. That is to say, the system-in-package module has better power consumption and operating performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A system-in-package module, comprising:
    a non-memory chip having a plurality of pads;
    a bundled memory comprising a first memory die and a second memory die, wherein the first memory die and the second memory die are side-by-side formed over a substrate, the first memory die comprises a first group of pads arranged over or near one side of the first memory die, and the second memory die comprises a second group of pads arranged over or near one side of the second memory die;
    an encapsulation package material enclosing the non-memory chip and the bundled memory, wherein the non-memory chip is electronically coupling with the bundled memory through the plurality of pads, the first group of pads, and the second group of pads; and
    at least one alignment mark disposed over a scribe line between the first memory die and the second memory die for positioning the scribe line and making the scribe line not to be cut;
    wherein the first group of pads correspond to the second group of pads by rotating a predetermined degree, wherein the predetermined degree is 90° or 270°.

2. The system-in-package module of claim 1, wherein the side with the first group of pads of the first memory die is not adjacent to the scribe line, and the side with the second group of pads of the second memory die is not adjacent to the scribe line.

3. The system-in-package module of claim 1, wherein the non-memory chip is disposed over or under the scribe line, or the non-memory chip and the bundled memory are disposed side-by-side.

4. The system-in-package module of claim 1, wherein the first group of pads comprises at least two row of pads over or near the side of the first memory die, and the second group of pads comprises at least two row of pads over or near the side of the second memory die.

5. The system-in-package module of claim 1, wherein the non-memory chip is electronically coupling with the bundled memory through the plurality of pads, the second group of pads, and the second group of pads by a wire bonding method or a flip chip bonding method.

6. The system-in-package module of claim 1,
    wherein the at least one alignment mark corresponds to a unique orientation of the bundled memory.

7. The system-in-package module of claim 1, wherein most or whole of the first group of pads and the second group of pads are not covered by an active circuit region of the non-memory chip.

8. The system-in-package module of claim 1, wherein a memory size of the bundled memory is greater than a memory size of the first memory die and a memory size of the second memory die, and a bus width of the bundled memory is equal to a bus width of the first memory die and a bus width of the second memory die.

9. The system-in-package module of claim 1, wherein a bus width of the bundled memory is greater than a bus width of the first memory die and a bus width of the second memory die, and a memory size of the bundled memory is equal to a memory size of the first memory die and a memory size of the second memory die.

10. A manufacture method for a system-in-package module, the manufacture method comprising:
    forming a bundled memory comprising a first memory die and a second memory die, wherein the first memory die and the second memory die are side-by-side formed over a substrate, the first memory die comprises a first group of pads arranged over or near one side of the first memory die, and the second memory die comprises a second group of pads arranged over or near one side of the second memory die, wherein the first group of pads correspond to the second group of pads by rotating a predetermined degree, and the predetermined degree is 90° or 270°; and
    forming at least one alignment mark disposed over a scribe line between the first memory die and the second memory die, wherein the at least one alignment mark is used for positioning the scribe line and making the scribe line not to be cut.

11. The manufacture method of claim 10, further comprising:
    providing a non-memory chip having a plurality of pads;
    electronically coupling with the bundled memory and the non-memory chip through the plurality of pads, the first group of pads and the second group of pads; and
    enclosing the non-memory chip and the bundled memory within an encapsulation package material.

12. The manufacture method of claim 10, wherein the at least one alignment mark corresponds to a unique orientation of the bundled memory.

* * * * *